United States Patent
Westphal

[11] Patent Number: 5,563,567
[45] Date of Patent: Oct. 8, 1996

[54] TRANSVERSE GRADIENT COIL SYSTEM

[75] Inventor: Michael Westphal, Offenbach, Germany

[73] Assignee: Bruker Analytische Messtechnik GmbH, Rheinstetten, Germany

[21] Appl. No.: 491,507

[22] Filed: Jun. 16, 1995

[30] Foreign Application Priority Data

Jun. 17, 1994 [DE] Germany .......................... 44 21 335.2

[51] Int. Cl.⁶ .................................................. G01V 3/00
[52] U.S. Cl. .......................................... 335/299; 324/318
[58] Field of Search .......................... 335/299; 324/318, 324/319, 320

[56] References Cited

U.S. PATENT DOCUMENTS

| | | | |
|---|---|---|---|
| 5,198,769 | 3/1993 | Frese et al. ............................ | 324/318 |
| 5,378,989 | 1/1995 | Barber et al. .......................... | 324/318 |
| 5,414,360 | 5/1995 | Westphal et al. ...................... | 324/318 |

FOREIGN PATENT DOCUMENTS

| | | | |
|---|---|---|---|
| 0551517 | 7/1993 | European Pat. Off. ........ | A61B 5/055 |
| 4029477 | 4/1991 | Germany ....................... | G01R 33/38 |
| 4210217 | 9/1993 | Germany ....................... | G01R 33/38 |
| 2265986 | 10/1993 | United Kingdom ........... | G01R 33/42 |

*Primary Examiner*—Leo P. Picard
*Assistant Examiner*—Raymond M. Barrera

[57] ABSTRACT

A gradient coil system for the production of a magnetic transverse gradient field $G_x$ in an NMR tomograph is presented. The main magnetic field $B_z$ is directed along the z-axis, the magnetic transverse gradient field $G_x$ along the x-axis, and the gradient coil system comprises four partial coils ($S_{1x}$, $S_{2x}$, $S_{3x}$, $S_{4x}$) each with two current connections ($A_1$, $A_2$). The coils are arranged mirror symmetrically with respect to the xy-plane (z=0) and mirror symmetrically with respect to the zy-plane and each partial coil contains only winding sections on an inner and an outer cylinder $Z_{ix}$, $Z_{ax}$ about the z-axis as well as in a radial connecting plane $V_{+x}$, $V_{-x}$ parallel to the xy-plane. The partial coils are configured in such a fashion that the winding sections on the inner and outer cylinder $Z_{ix}$, $Z_{ax}$ are axially further removed from the xy-plane than the corresponding radial connecting planes $V_{+x}$, $V_{-x}$, and the axial separation $d_{Vx}$ of the connecting planes $V_{+x}$, $V_{-x}$ from each other is less than the radial separation $d_{zx}$ between the inner and the outer cylinder $Z_{ix}$, $Z_{ax}$. In this fashion a nearly perfect outward shielding is achieved.

16 Claims, 6 Drawing Sheets

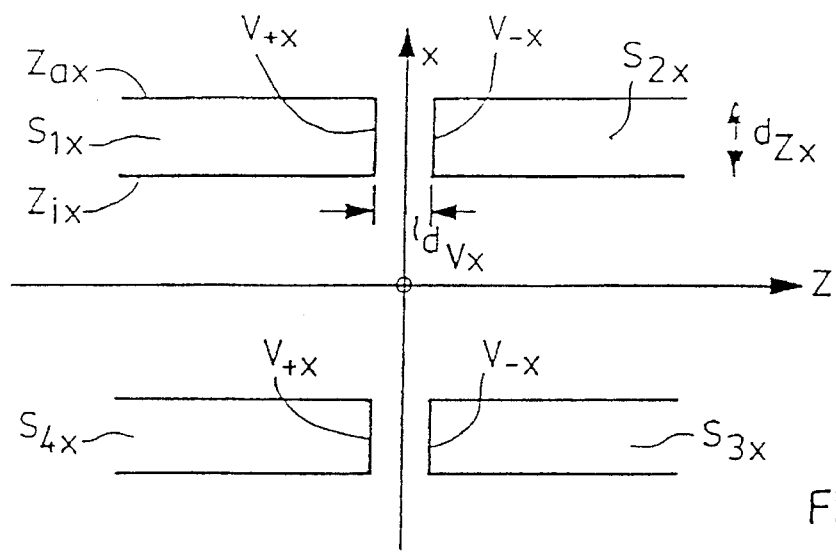
Fig. 4a
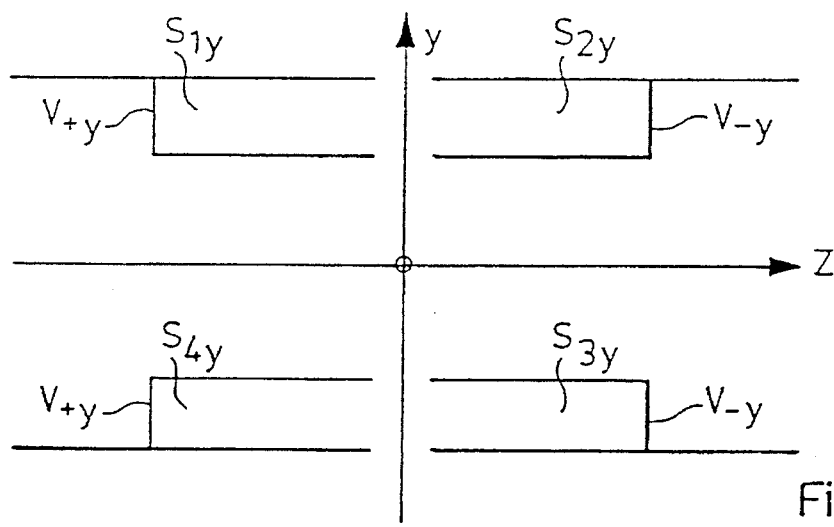
Fig. 4b
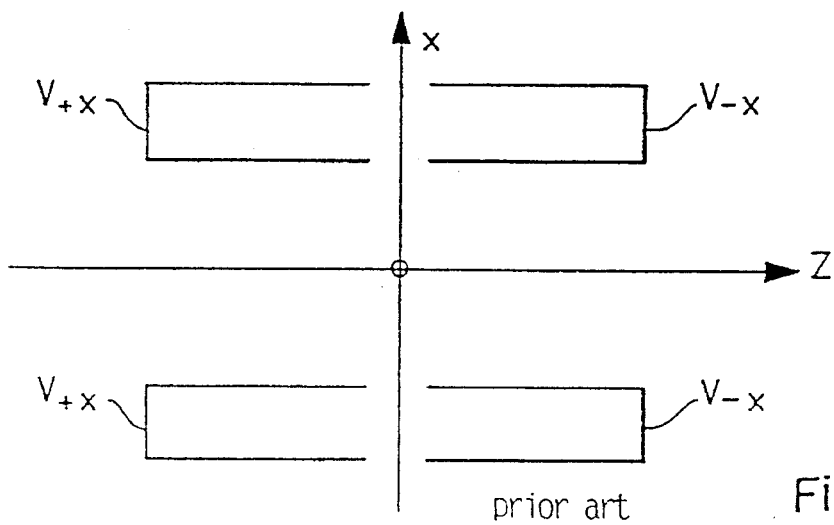
prior art  Fig. 4c

TRANSVERSE GRADIENT COIL SYSTEM

BACKGROUND OF THE INVENTION

The invention concerns a gradient coil system for the production of a magnetic transverse gradient field $G_x=dB_z/dx$ in a nuclear magnetic resonance (NMR) tomograph or spectrometer with a main field magnet for the production of a homogeneous static main magnetic field $B_z$ in a measuring volume whose center coincides with an origin of a Cartesian x-, y-, z-coordinate system, whereby the main magnetic field $B_z$ is directed along the z-axis and the magnetic transverse gradient field $G_x$ along the x-axis of this coordinate system, whereby the gradient coil system comprises four partial coils ($S_{1x}$, $S_{2x}$, $S_{3x}$, $S_{4x}$) each having two current connections ($A_1$, $A_2$) which are arranged mirror symmetrically with respect to the xy-plane (z=0) and mirror symmetrically with respect to the zy-plane (x=0), whereby each partial coil contains winding sections on only an inner and an outer cylinder $Z_{ix}$, $Z_{ax}$ extending about the z-axis and, in each case, in a radial connecting plane $V_{+x}$, $V_{-x}$ parallel to the xy-plane, whereby the winding sections of each partial coil have current flowing through them in series during operation and whereby the radial connecting planes $V_{+x}$, $V_{-x}$ of those partial coils ($S_{1x}$, $S_{4x}$; $S_{2x}$, $S_{3x}$) which lie across from each other relative to the zy-plane, are identical.

A gradient coil system of this kind is known in the art from GB 22 65 986 A.

An essential component of NMR systems utilized primarily for tomography but also to a certain extent for spectroscopy, is a system of normally three gradient coils comprising a plurality of partial coils which are to be independently fed with currents of differing strengths. These coils serve the purpose of overlapping the homogeneous magnetic field $B_{0z}$ of the main field magnet with constant field gradients of adjustable strength, whereby the direction of one of these gradients ($dB_z/dz$) is normally parallel to the direction of the homogeneous main field $B_{0z}$, i.e. to the z-axis (z-gradient=axial gradient) and the direction of the two other gradients ($dB_z/dx$, $dB_z/dy$) run orthogonal thereto and to each other transverse to the direction of the main field (x and y-gradients=transverse gradients). The spatial region in which the magnetic field of these gradient coils has a nearly linear dependence can be utilized for spatially resolved NMR methods (imaging, volume selective spectroscopy) to the extent that these regions are not further limited by main field inhomogeneities.

In order to shield the effect of the gradient coils towards the outside, active shielding coils, associated with each partial coil of the gradient coil system, are provided for in the systems known in the art having a larger radial separation from the z-axis than the gradient coils themselves. For example, known in the art from DE 42 10 217 A1 is a transverse gradient coil system, for example to produce an x-gradient $G_x$ which, in addition to the four partial coils for the production of the x-gradients $G_x$, comprises an additional four partial coils for shielding the gradient coils. The x-gradient coil system known in the art therefore consists of a total of eight partial coils of which the actual gradient coils are arranged on a inner cylinder and the shielding coils on an outer cylinder about the z-axis.

A disadvantage of this conventional gradient coil system is that, for the production of the transverse gradient, only one partial coil region is useful which lies in the vicinity of the xy-plane (z=0). The return sections of the partial coils are, in contrast, not usable or even destructive with regard to the produced transverse gradient linearity. In addition these return sections increase the electrical resistivity as well as the total inductivity and the entire length of the gradient coil system.

An improvement is, in contrast thereto, represented by the gradient coil system in accordance with the above mentioned GB 22 65 986 A. The system presented therein contains only four instead of eight partial coils per gradient device, whereby each coil comprises of two cylindrical sections and one planar section connecting the two sections in a plane perpendicular to the z-axis. The return loops are, in contrast to the configuration in accordance with DE 42 10 217 A1 fed, as it were, in a radially outward plane and close in on themselves on a shielding cylinder of large radius. Towards this end the connecting plane V of the sections of each partial coil is, in each case, located on the portion of the coil facing away from the xy-plane, i.e. at maximum distance from the middle plane.

The gradient coil system in accordance with GB 22 65 986 A has a smaller electrical resistivity, a lower inductivity and a smaller axial extension along the z-axis than, for example, the system described in DE 42 10 217 A1. In addition, this gradient coil system has transverse gradients with better linearity and no "gradient reversal" in the vicinity of return loops is observed.

GB 22 65 986 A however only discloses configurations in which the shielding windings located on the outer cylinder extend from the radially connecting plane V towards the middle plane (z=0). The connecting planes V of both cylinders in which the radial sections of the windings of the corresponding partial coils are located, is therefore at a maximum separation from the xy-plane. A configuration of this type generally shields the effect of the transverse gradient towards the outside in an imperfect manner since, in the region of the corresponding connecting plane V, unshielded stray fields remain which can only be compensated by currents which, as seen from the middle plane (z=0) must flow on the other side of the connecting plane V. This is, however, in the gradient coil configuration in accordance with GB 22 65 986 A, impossible.

It is therefore the purpose of the current invention to present a gradient coil system of the above mentioned kind which exhibits nearly perfect shielding, whereby the advantages of the system known in the art through GB 22 65 986 A compared to, for example, the system known in the art from DE 42 10 217 A1 are, however, preserved.

SUMMARY OF THE INVENTION

This purpose is achieved in accordance with the invention in a manner as surprisingly simple as effective in that the partial coils ($S_{1x}$, $S_{2x}$, $S_{3x}$, $S_{4x}$) are configured in such a fashion that the winding sections on the inner and outer cylinders $Z_{ix}$, $Z_{ax}$ are axially further separated from the zy-plane than the corresponding radial connecting planes $V_{+x}$, $V_{-x}$, and the axial separation $d_{Vx}$ of the connecting planes $V_{+x}$, $V_{-x}$ from each other is smaller than the radial separation $d_{Vx}$ between the inner and outer cylinder $Z_{ix}$, $Z_{ax}$.

Thereby, the fundamental realization of the invention is that a nearly ideal shielding generally requires that at least several return loops on the outer cylinder do not extend from the radial connecting plane V to the middle plane (z=0) rather axially away therefrom. This can be achieved most easily and effectively by the means described above in accordance with the invention.

In order to achieve an optimal shielding effect, the separation $d_{Vx}$ of the connecting planes $V_{+x}$, $V_{-x}$ from each other should be as small as possible.

In an embodiment of the gradient coil system in accordance with the invention the axial separation $d_{Vx}$ of the connecting planes $V_{+x}$, $V_{-x}$ from each other is less than 20% of the radial separation $d_{zx}$ between the inner and outer cylinder $Z_{ix}$, $Z_{ax}$, preferentially smaller or equal to 10% of the separation $d_{zx}$.

In another embodiment the axial separation $d_{Vx}$ of the connecting planes $V_{+x}$, $V_{-x}$ from each other is less than 10 mm, preferentially, less than or equal to 3 mm.

An embodiment of the gradient system in accordance with the invention which is particularly easy to manufacture is preferred with which the inner and outer cylinders $Z_{ix}$, $Z_{ax}$ are each circular cylinders extending about the z-axis.

In an improvement of this embodiment, the axial separation $d_{Vx}$ of the connecting planes $V_{+x}$, $V_{-x}$ from each other is less than 10% of the radius of the inner cylinder $Z_{ix}$, preferentially smaller or equal to 4% of this radius.

In this fashion particularly good gradient coil system shielding is achieved.

Ideally, the axial separation $d_{Vx}$ of the connecting planes $V_{+x}$, $V_{-x}$ from each other is approximately zero. The radial connecting planes of the partial coils directly abut each other with the exception of a thin insulating layer.

An x-gradient coil system in accordance with the invention is particularly preferred with which a y-gradient coil system for the production of a magnetic transverse gradient field $G_y=dB_z/dy$ in the y-direction is also provided for whose partial coils ($S_{1y}$, $S_{2y}$, $S_{3y}$, $S_{4y}$) are arranged rotated by 90° about the z-axis relative to the x-gradient coil system.

As was the case with the x-gradient coil system in accordance with the invention, the y-gradient coil system can comprise four partial coils ($S_{1y}$, $S_{2y}$, $S_{3y}$, $S_{4y}$) with two current connections each which are arranged mirror symmetrically with respect to the xy-plane ($z=0$) and mirror symmetrically with respect to the zx-plane (($y=0$), whereby each partial coil only contains winding sections on an inner and an outer cylinder $Z_{iy}$, $Z_{ay}$ about the z-axis as well as in a radial connecting plane $V_{+y}$, $V_{-y}$ parallel to the xy-plane, whereby the winding sections of each partial coil have current flowing through them in series during operation and whereby the radial connecting planes $V_{+y}$, $V_{-y}$ of those partial coils ($S_{1y}$, $S_{4y}$; $S_{2y}$, $S_{3y}$) lying across from each other relative to the zx-plane are identical.

An improvement of this system is particularly preferred with which the y-gradient coil system is configured in the manner of the above described x-gradient coil system. In this fashion the advantages mentioned for the gradient coil system in accordance with the invention are also present for the y-gradients.

An improvement of this gradient coil system is topologically advantageous with which the outer cylinder $Z_{ay}$ of the y-gradient system exhibits a smaller radius than the outer cylinder $Z_{ax}$ of the x-gradient coil system, the inner cylinder $Z_{iy}$ of the y-gradient system exhibits a larger radius than the inner cylinder $Z_{ix}$ of the x-gradient coil system, and the partial coils ($S_{1y}$, $S_{2y}$, $S_{3y}$, $S_{4y}$) of the y-gradient coil system are inserted into the partial coils ($S_{1x}$, $S_{2x}$, $S_{3x}$, $S_{4x}$) of the x-gradient coil system in the z-direction.

Another embodiment distinguishes itself by winding sections with separations from the xy-plane ($z=0$) which are larger and smaller than the separation $d_{Vy}/2$ of the connecting planes $V_{+y}$, $V_{-y}$ of the corresponding partial coil from the xy-plane, the sections being provided for on the outer cylinder $Z_{ay}$ of the partial coils ($S_{1y}$, $S_{2y}$, $S_{3y}$, $S_{4y}$) of the y-gradient coil system.

Such a y-gradient coil system does not have all the advantages of the above mentioned x-gradient coil system in accordance with the invention, however, provides nevertheless for a better shielding effect than, for example, a system in accordance with GB 22 65 986 A.

In order to be able to configure the y-gradient coil system together with the x-gradient coil system in accordance with the invention in a spatially compact fashion within an NMR apparatus, the following four possibilities exist:

the outer cylinder $Z_{ay}$ has a smaller radius than the outer cylinder $Z_{ax}$ and the inner cylinder $Z_{iy}$ has a smaller radius than the inner cylinder $Z_{ix}$; or the outer cylinder $Z_{ay}$ has a larger radius than the outer cylinder $Z_{ax}$ and the inner cylinder $Z_{iy}$ has a larger radius than the inner cylinder $Z_{ix}$; or the outer cylinder $Z_{ay}$ has a smaller radius than the outer cylinder $Z_{ax}$ and the inner cylinder $Z_{iy}$ has a larger radius than the inner cylinder $Z_{ix}$; or the outer cylinder $Z_{ay}$ has a larger radius than the outer cylinder $Z_{ax}$ and the inner cylinder $Z_{iy}$ has a smaller radius than the inner cylinder $Z_{ix}$.

An embodiment of the gradient coil system in accordance with the invention is particularly advantageous with which the partial coils ($S_{1x}$, $S_{2x}$, $S_{3x}$, $S_{4x}$; $S_{1y}$, $S_{2y}$, $S_{3y}$, $S_{4y}$) are so-called "streamline" coils having flat conducting sections and quasi-continuous current distribution.

This type of "streamline" coils as well as methods for their optimum calculation and for their manufacture are described in detail, for example, in the above cited DE 42 10 217 A1 the contents of which is hereby incorporated by reference.

Further advantages of the invention can be derived from the description and the accompanying drawing. The above mentioned features as well as those to be described in detail below in accordance with the invention can be utilized individually or collectively in arbitrary combination. The embodiments shown are not to be considered as exhaustive enumeration, rather have exemplary character only.

The invention is represented in the drawing and will be more closely described and explained with reference to concrete embodiments.

BRIEF DESCRIPTION OF THE DRAWING

FIG. 4a shows schematic cuts of an x-gradient coil system through the zx-, or zy-plane with partial coils arranged in accordance with the invention;

FIG. 4b shows schematic cuts of an x-gradient coil system through the zx-, or zy-plane with partial coils improved in accordance with the invention relative to prior art;

FIG. 4c shows schematic cuts of an x-gradient coil system through the zx-, or zy-plane with partial coils according to prior art (GB 22 65 986 A);

DESCRIPTION OF THE PREFERRED EMBODIMENT

Figure 1A:
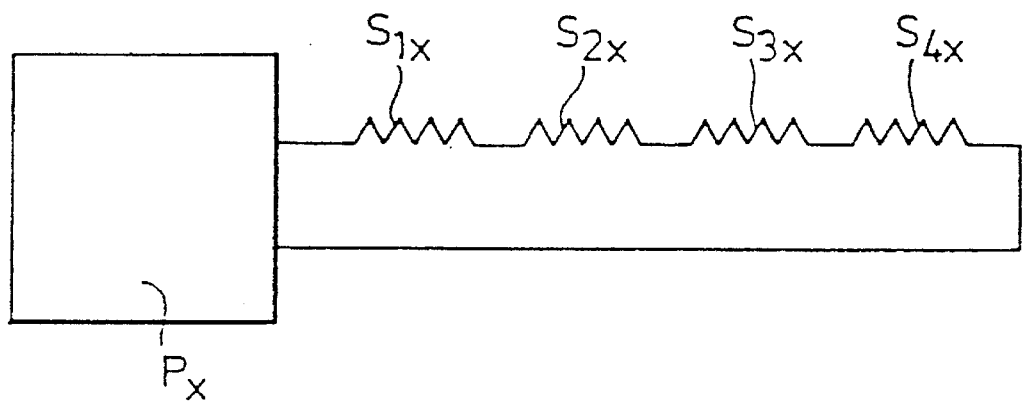
FIG. 1A shows a schematic representation of the electrical series connection of a gradient coil system in accordance with the invention in the x-direction.
Figure 1B:
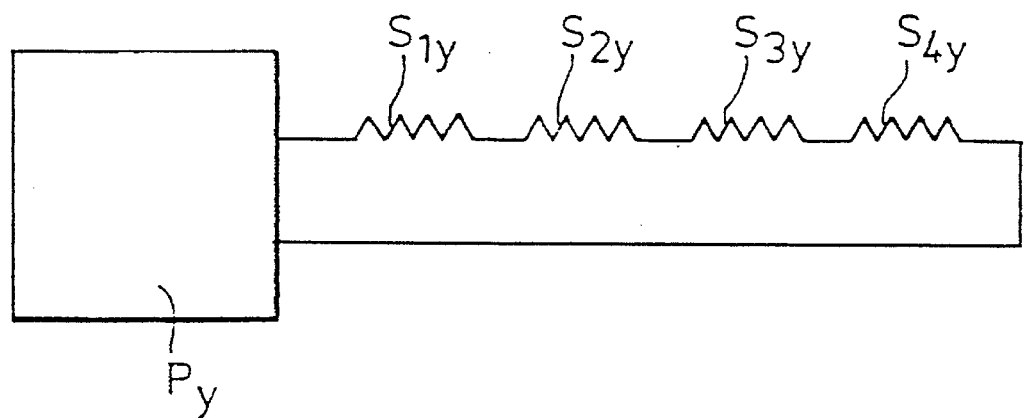
FIG. 1B shows a schematic representation of the electrical series connection of a gradient coil system in accordance with the invention in the y-direction.

The circuit diagrams represented in FIGS. 1A and 1B of a gradient coil system in accordance with the invention shows in FIG. 1A, a power supply $P_x$, which supplies current to partial coils $S_{1x}$, $S_{2x}$, $S_{3x}$ and $S_{4x}$ of an x-gradient coil system connected in series. Also shown, in FIG. 1B, is a y-gradient coil system with the partial coils $S_{1y}$, $S_{2y}$, $S_{3y}$ and $S_{4y}$, connected in series as well as their current supply, an additional power supply $P_y$.

Figure 2:
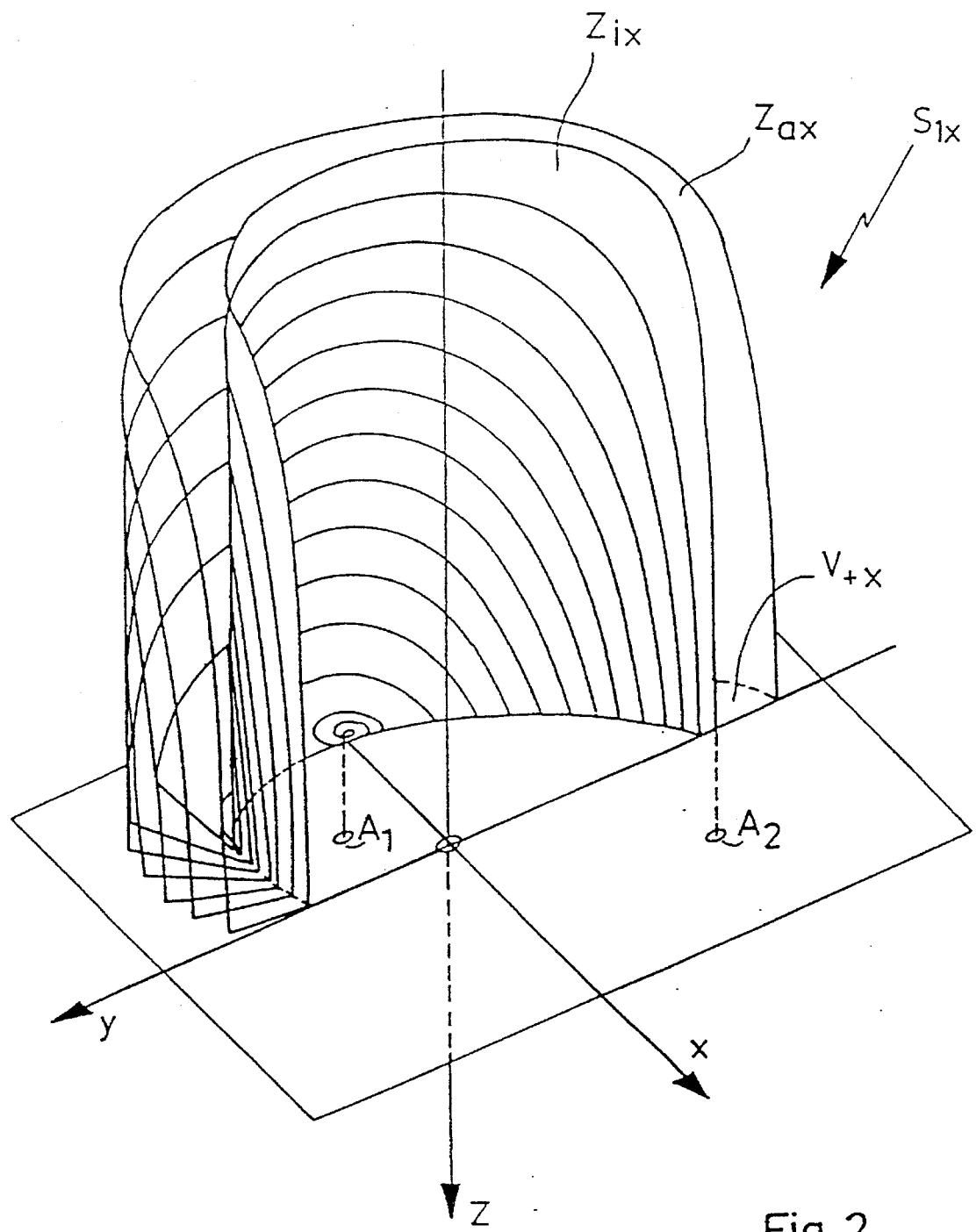
FIG. 2 shows a spatial representation of an embodiment of a partial coil of the x-gradient coil system in accordance with the invention.

FIG. 2 shows a concrete embodiment of a partial coil $S_{1x}$ of an x-gradient coil system in accordance with the invention with which that part of the gradient coil winding which contributes most significantly to the production of a linear x-gradient is positioned on an inner cylinder $Z_{ix}$ about the z-axis of a Cartesian x-, y-, z-coordinate system. Winding sections are provided for on an outer cylinder $Z_{ax}$ of the partial coil $S_{1x}$ for shielding the effects of the gradient towards the outside. A connection between the winding sections on the inner cylinder $Z_{ix}$ with those on the outer cylinder $Z_{ax}$ is effected by the radial winding sections in a plane $V_{+x}$, which runs parallel to the xy-plane. Both current connections $A_1$ and $A_2$ of the partial coil $S_{1x}$ are also schematically represented. The coordinate origin in FIG. 2 also simultaneously indicates the center of the homogeneity volume of an NMR apparatus in which the represented partial coils $S_{1x}$ of an x-gradient coil system are utilized.

Figure 3A:
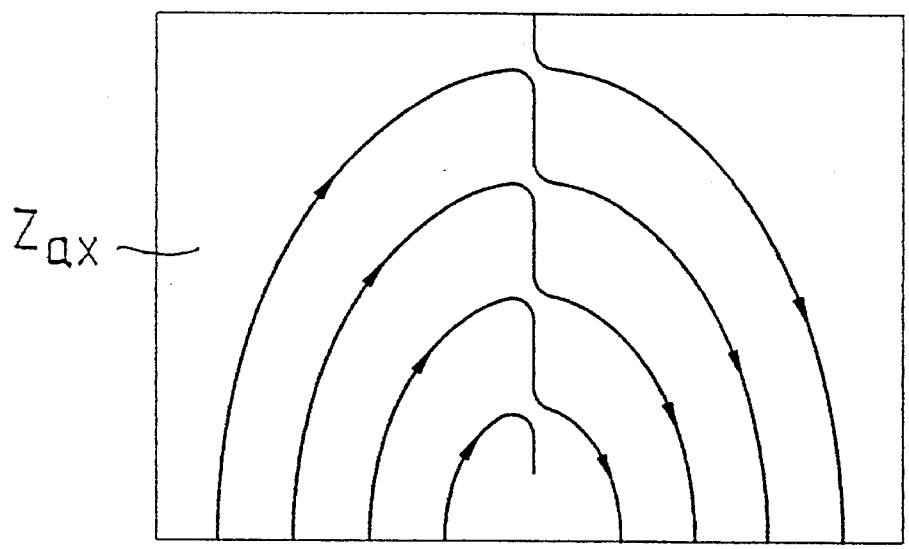
FIG. 3a shows the windings of a partial coil of the x-gradient coil system in accordance with the invention with winding sections on the outer cylinder $Z_{ax}$.
Figure 3B:
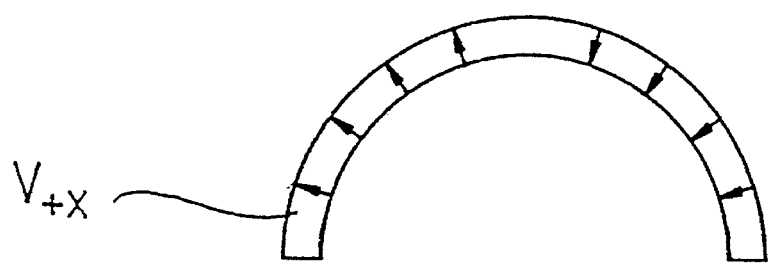
FIG. 3b shows the windings of a partial coil of the x-gradient coil system in accordance with the invention with winding sections on a radial connecting plane $V_x$.
Figure 3C:
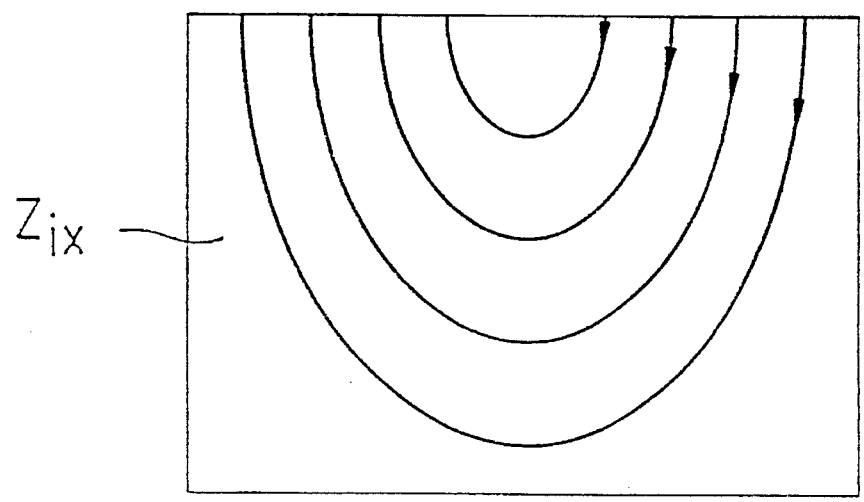
FIG. 3c shows the windings of a partial coil of the x-gradient coil system in accordance with the invention with winding sections on the inner cylinder $Z_{ix}$.

FIG. 3a shows a winding of the winding section of a partial coil $S_{1x}$ on an outer cylinder $Z_{ax}$, FIG. 3b the corresponding winding of the winding section on a radial connecting plane $V_x$ between the outer cylinder $Z_{ax}$ and the inner cylinder $Z_{ix}$ and FIG. 3c the winding of the winding section on the inner cylinder $Z_{ix}$.

Reference is made to the methods known in the art for the calculation of winding distributions of this type in accordance with the DE 42 10 217 A1. In principle, a method for the calculation of the winding locations of the shielding portion of a partial coil, e.g. the curves on the outer cylinder $Z_{ax}$ would be the following:

a) One takes an arbitrary winding location of the partial coil on the inner cylinder $Z_{ix}$ corresponding to the actual linearity requirements of the gradient field.

b) In the radial connecting plane, the windings are largely guided radially from the inner cylinder $Z_{ix}$ towards the outer cylinder $Z_{ax}$ and are closed along the line of intersection between the radial connecting plane and the outer cylinder $Z_{ax}$ in the azimuthal direction.

c) One imagines the existence of a superconducting outer cylinder $Z_{ax}$ about the inner cylinder $Z_{ix}$ in which superconducting shielding currents corresponding to the currents in the inner cylinder $Z_{ix}$ are excited. The current density dependence in the outer cylinder $Z_{ax}$ is approximated by the discrete guiding of the windings in the shielding cylinder, whereby a non-avoidable singularity in the calculated current in the connecting plane $V_x$ is neglected. In this manner one obtains a corresponding optimized winding dependence on the outer cylinder $Z_{ax}$.

Schematic cuts through the zx- and zy-planes respectively in an x-gradient coil system having four partial coils are shown, in each case, in FIGS. 4a through 4c. The x-gradient coil system in accordance with the invention is represented in FIG. 4a. The partial coils $S_{1x}$ and $S_{2x}$ and $S_{3x}$ and $S_{4x}$ respectively are mirror symmetrically arranged across from each other with respect to the xy-plane. The inner cylinders $Z_{ix}$ are separated from the outer cylinders $Z_{ax}$ by a length $d_{zx}$. The radial connecting planes $V_{+x}$ and $V_{-x}$ in which the winding sections of the corresponding partial coils are accommodated which connect the winding sections on the outer and on the inner cylinder, are separated by a distance $d_{Vx}$ and should lie across from and as close to another as possible. In the theoretically optimal case the radial connecting planes $V_{+x}$ and $V_{-x}$ coincide with the xy-plane, whereas in practice an insulating sheet must separate the coils in both planes electrically and spatially.

The gradient coil configuration schematically shown in FIG. 4b already represents, in and of itself, an improvement over the configuration known in the art since, due to those winding sections on the outer cylinder which are more separated from the xy-plane than the connecting planes V, a significantly better shielding is achieved than with the configuration of prior art. In contrast to the configuration in accordance with the invention shown in FIG. 4a, this type of transverse gradient system can, however, only be applied in certain cases, for example, only as a y or an x-gradient coil system, since a nesting of the corresponding orthogonal transverse gradient system is not possible for topological reasons.

A system according to prior art (GB 22 65 986 A) is schematically shown in FIG. 4c. A gradient coil system of this type can be simultaneously utilized both as an x as well as a y-gradient coil system in the same apparatus in an appropriately nested fashion, but, however, has a substantially lower shielding effect than the system shown in FIG. 4b and a substantially lower shielding effect than the gradient coil system in accordance with the invention shown in FIG. 4a.

Figure 5:
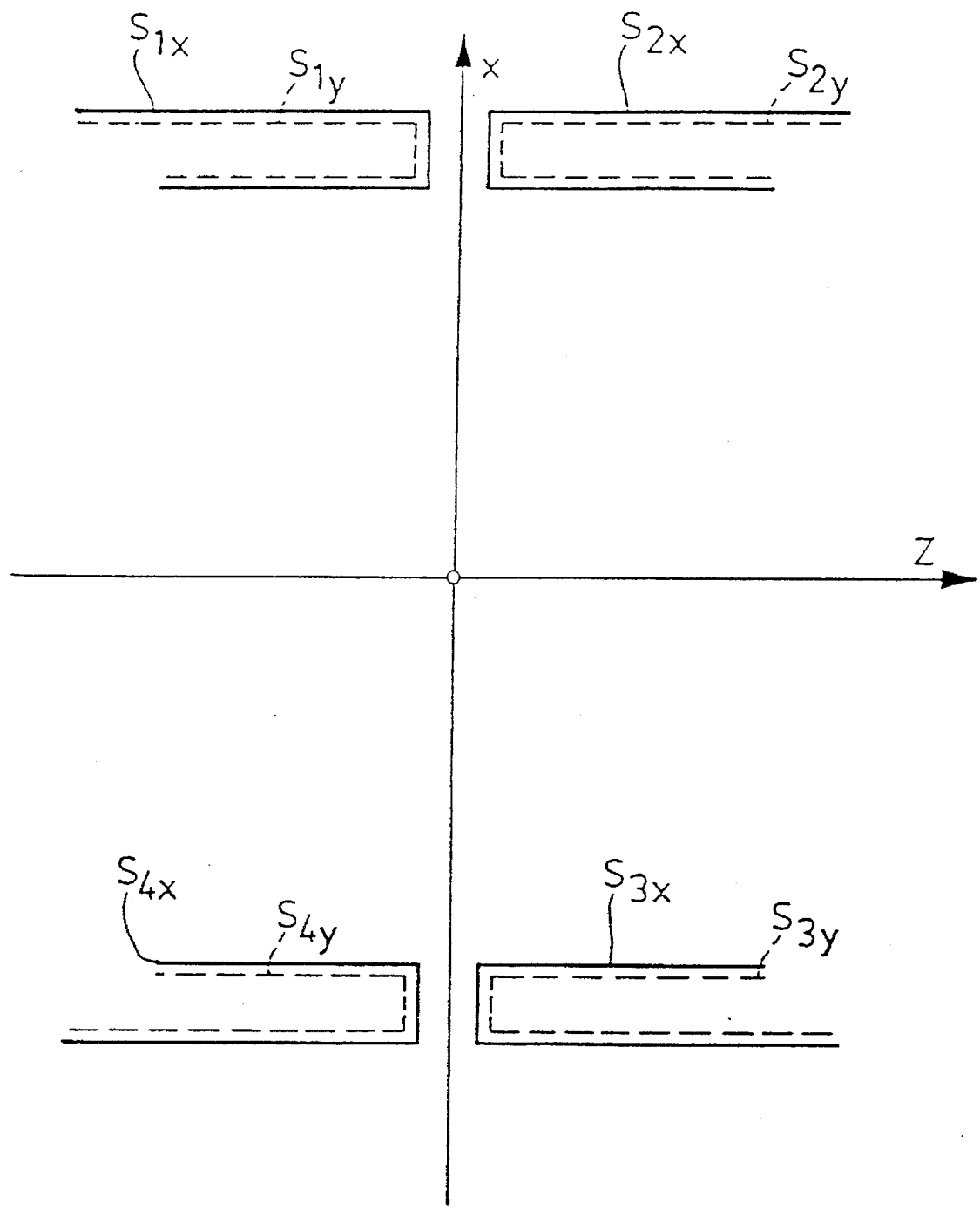
FIG. 5 as in FIG. 4a but with a y-gradient coil system which is nested with an x-gradient coil system and which largely comprises the features of the x-gradient system in accordance with the invention.
Figure 6A:
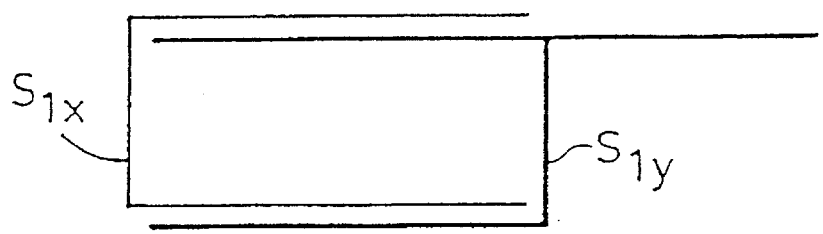
FIG. 6a shows a schematic cut of partial coils of an x-gradient coil system in accordance with FIG. 4a and a y-gradient coil system corresponding to FIG. 4b in a first spatial orientation with respect to each other.
Figure 6B:
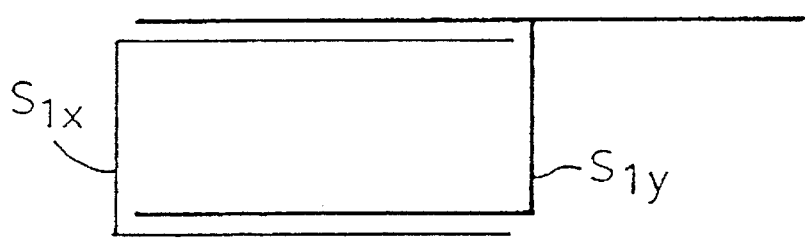
FIG. 6b shows a schematic cut of partial coils of an x-gradient coil system in accordance with FIG. 4a and a y-gradient coil system corresponding to FIG. 4b in a second spatial orientation with respect to each other.
Figure 6C:
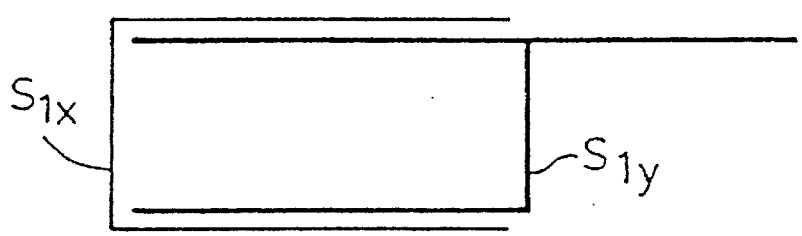
FIG. 6c shows a schematic cut of partial coils of an x-gradient coil system in accordance with FIG. 4a and a y-gradient coil system corresponding to FIG. 4b in a third spatial orientation with respect to each other.
Figure 6D:
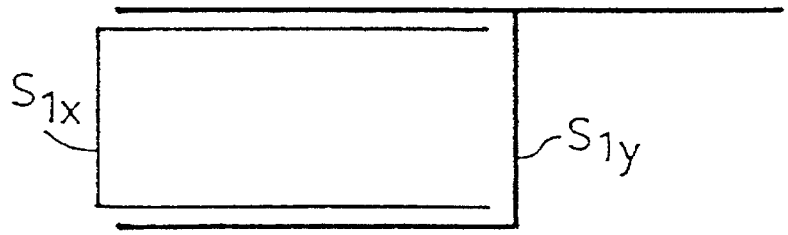
FIG. 6d shows a schematic cut of partial coils of an x-gradient coil system in accordance with FIG. 4a and a y-gradient coil system corresponding to FIG. 4b in a fourth spatial orientation with respect to each other.

FIG. 5 shows, in a schematic cut through zx-plane, a nesting of two gradient coil systems in accordance with the invention corresponding to FIG. 4a, whereby the outer one produces a transverse gradient $G_x$ in the x-direction and the inner coil system a transverse gradient Gy in the y-direction.

The two transverse gradient coil systems are azimuthally rotated about the z-axis with respect to each other by 90°.

Finally, FIGS. 6a through 6d each show one partial coil of an x-gradient coil system in accordance with the invention corresponding to FIG. 4a nested with an associated y-gradient coil system corresponding to FIG. 4b. Here one is dealing with schematic cut representations in the zx-plane, whereby, as described above, the x-gradient coil system is rotated azimuthally relative to the y-gradient system by 90°.

We claim:

1. A gradient coil system for nuclear magnetic resonance, the system producing an x-transverse gradient field $G_x=dB_z/dx$ overlapping a main homogeneous static magnetic field $B_z$ in a measuring volume having a center defined by the origin in Cartesian x-, y-, z-coordinates, the gradient coil system comprising:

four x-partial coils, each x-partial coil having two x-current connections, the four x-partial coils arranged mirror symmetrically with respect to the xy (z=0) and zy (x=0) planes, each x-partial coil consisting essentially of an inner x-cylindrical winding section, an outer x-cylindrical winding section, and a planar x-winding section connecting the inner x- and outer x-sections in series, the inner x- and outer x-sections extending about the z-axis and the planar x-section being parallel to the xy-plane and coplanar to the planar x-winding section of the x-partial coil located on an opposite side of the zy-plane, the inner x- and outer x-sections comprising x-windings having a larger axial separation from the xy-plane than the planar x-section, an axial separation $d_{v_x}$ between two planar x-sections of two x-partial coils in the xz-plane being smaller than a radial separation $d_{zx}$ between the inner x- and outer x-sections.

2. The gradient coil system of claim 1, wherein $d_{v_x}<0.2d_{zx}$.

3. The gradient coil system of claim 1, wherein $d_{v_x}<10$ mm.

4. The gradient coil system of claim 1, wherein the inner and outer sections have a circular cylinder shape.

5. The gradient coil system of claim 4, wherein $d_{v_x}$ is less than 10% of a radius of the inner section.

6. The gradient coil system of claim 1, wherein $d_{v_x}$ is approximately zero.

7. The gradient coil system of claim 1, further comprising a y-gradient coil producing a transverse gradient field $G_y=dB_z/dy$ in the y-direction, the y-gradient coil having partial coils rotated by 90° about the z-axis with respect to an x-gradient coil.

8. The gradient coil system of claim 7, wherein there are four y-partial coils, each y-partial coil having two y-current connections, the four y-partial coils arranged mirror symmetrically with respect to the xy (z=0) and zx (y=0) planes, each y-partial coil consisting essentially of an inner y-cylindrical winding section, an outer y-cylindrical winding section, and a planar y-winding section connecting the inner y- and outer y-sections in series, the inner y- and outer y-sections extending about the z-axis and the planar y-section being parallel to the xy-plane and coplanar to the planar y-winding section of the y-partial coil located on an opposite side of the zx-plane.

9. The gradient coil system of claim 8, wherein the inner y- and outer y-sections comprise y-windings having a larger axial separation from the xy-plane than the planar y-section, an axial separation $d_{v_y}$ between two planar y-sections of two partial y-coils in the yz-plane being smaller than a radial separation $d_{zy}$ between the inner y- and outer y-sections.

10. The gradient coil system of claim 9, wherein the outer y-section has a smaller radius than the outer x-section and the inner y-section has a larger radius than the inner x-section, the y-partial coils being inserted into the x-partial coils in the z-direction.

11. The gradient coil system of claim 8, wherein the outer y-section comprises y-windings having lager and smaller axial separations from the xy-plane (z=0) than the planar y-section.

12. The gradient coil system of claim 11, wherein the outer y-section has a smaller radius than the outer x-section and the inner y-section has a smaller radius than the inner x-section.

13. The gradient coil system of claim 11, wherein the outer y-section has a larger radius than the outer x-section and the inner y-section has a larger radius than the inner x-section.

14. The gradient coil system of claim 11, wherein the outer y-section has a smaller radius than the outer x-section and the inner y-section has a larger radius than the inner x-section.

15. The gradient coil system of claim 11, wherein the outer y-section has a larger radius than the outer x-section and the inner y-section has a smaller radius than the inner x-section.

16. The gradient coil system of claim 1, wherein the partial coils are streamline coils having flat conducting sections and essentially continuous current distributions.

* * * * *